United States Patent [19]

McDonald

[11] Patent Number: 4,635,788
[45] Date of Patent: Jan. 13, 1987

[54] CONVEYOR

[75] Inventor: David I. McDonald, Cincinnati, Ohio

[73] Assignee: Cincinnati Milacron Inc., Cincinnati, Ohio

[21] Appl. No.: 630,050

[22] Filed: Jul. 12, 1984

[51] Int. Cl.$^4$ .............................................. B65G 15/54
[52] U.S. Cl. ................................... 198/848; 198/814; 198/690.2
[58] Field of Search ............... 198/814, 848, 849, 957, 198/345, 859, 713, 714, 690.2; 474/117, 135, 138; 209/401, 405, 412

[56] References Cited

U.S. PATENT DOCUMENTS

| | | | |
|---|---|---|---|
| 2,833,394 | 5/1958 | Cordis | 198/814 X |
| 3,312,116 | 4/1967 | Blevins | 474/135 X |
| 3,773,166 | 11/1973 | Nowacki | 198/814 X |
| 4,179,948 | 12/1979 | Lang-Ree | 198/814 X |
| 4,338,078 | 7/1982 | Lampkin | 198/849 X |
| 4,417,535 | 11/1983 | Hannemann | 198/814 X |
| 4,457,702 | 7/1984 | Marchetti | 432/11 |
| 4,469,993 | 9/1984 | Swanson et al. | 198/859 X |

FOREIGN PATENT DOCUMENTS 0936200 12/1955 Fed. Rep. of Germany ... 198/690.2

OTHER PUBLICATIONS

Dupont–"The Journal of Teflon", vol. 4, No. 7, Sep. 1963.
Sparks–"Conveyor and Elevator Belting", p. 5, prior to Dec. 1979.

Primary Examiner—Robert J. Spar
Assistant Examiner—Lyle Kimms
Attorney, Agent, or Firm—Daniel P. Worth

[57] ABSTRACT

An endless belt type of conveyor for small flat workpieces (chips) provides a series of pockets on a perforate belt, each pocket adapted to support a chip during conveyance through a zone wherein high velocity air jets are directed against the chip. The pockets are formed by facing pairs of series of "H" or "I" shaped crossbars connected between a spaced-apart pair of roller chains. The perforate belt is formed by a Teflon (polytetraflouroethylene) coated fiberglass screen (alternatively silicon rubber) supported by the H crossbars. This construction permits the pockets to move readily around the sprockets about which the roller chains are wound.

18 Claims, 15 Drawing Figures

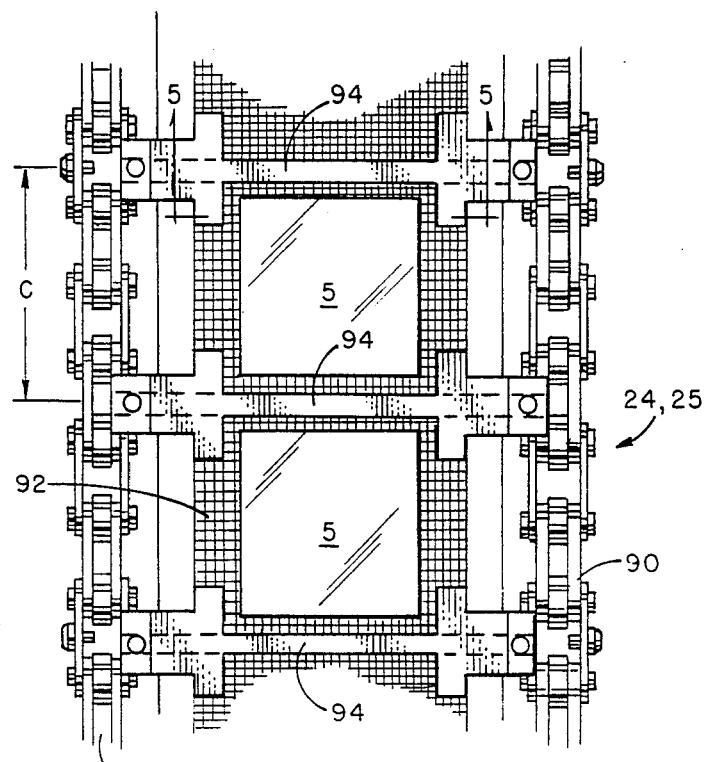
Fig. 3
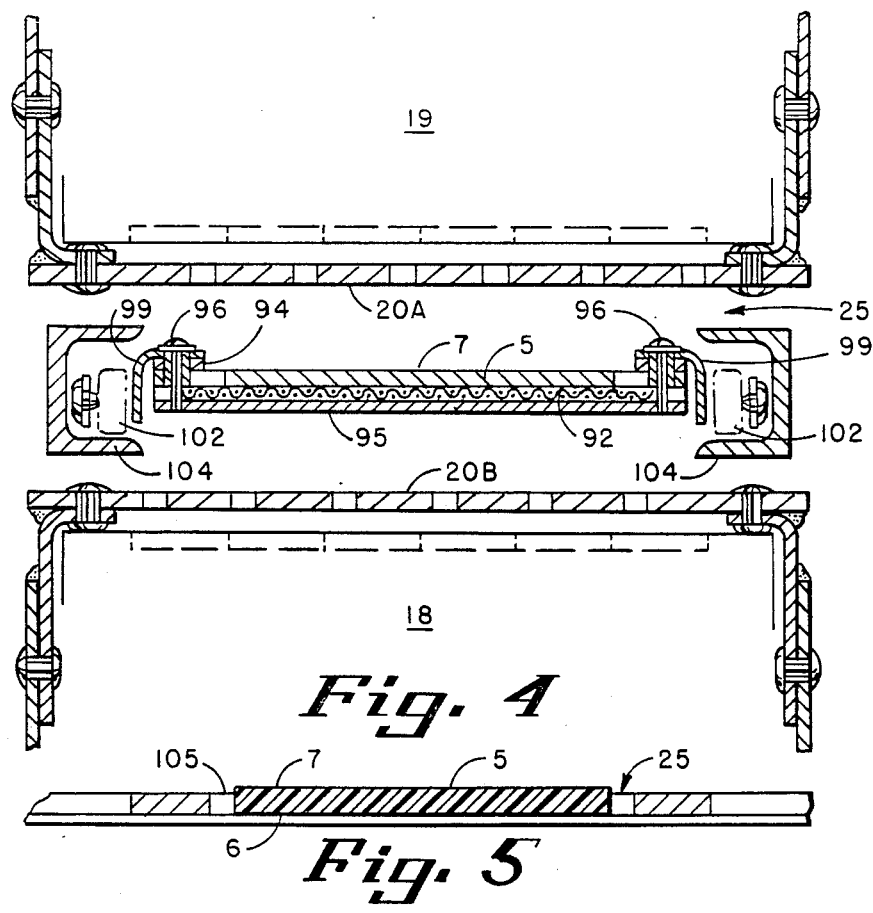
Fig. 4
Fig. 5

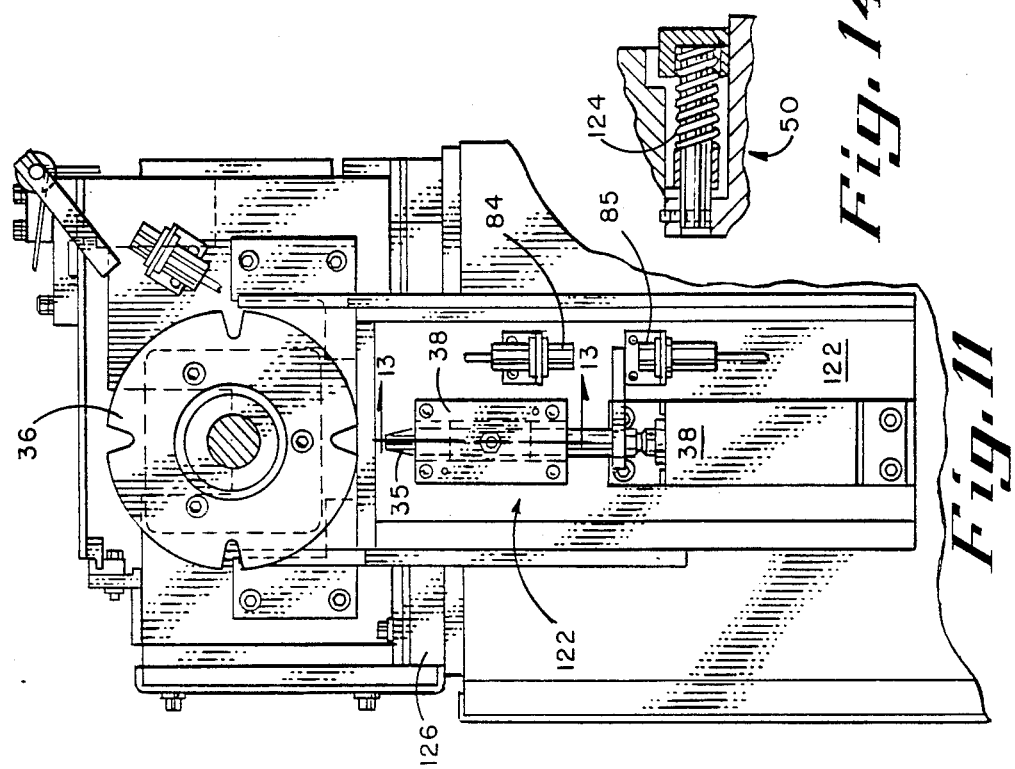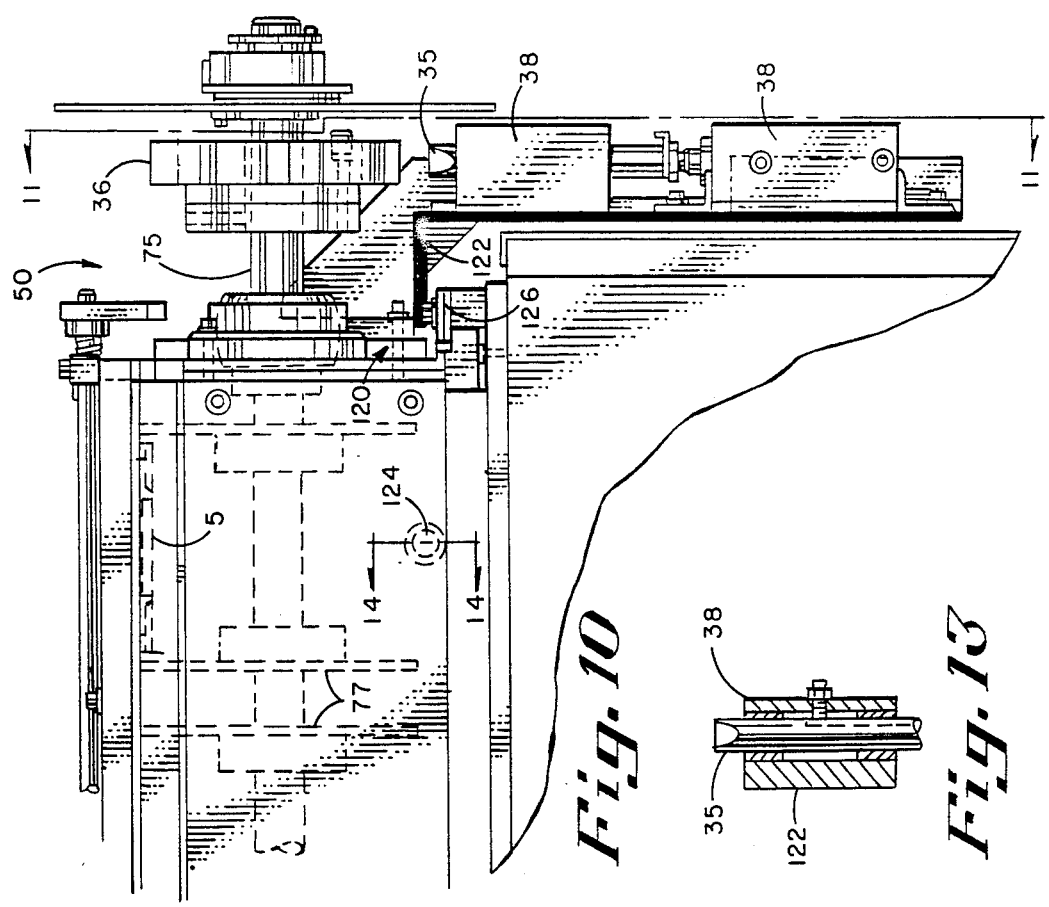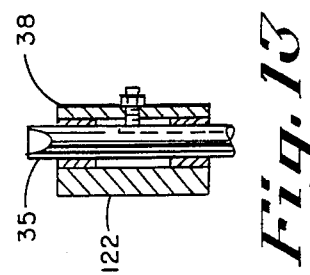

CONVEYOR

This invention relates to an improved conveyor. One aspect of the invention relates to an improved conveyor belt for conveying flat workpieces through a zone in which high velocity fluid jets impinge on the workpieces. An aspect of the invention relates to a conveyor drive and support system that is self-compensating for dimensional changes while still maintaining the workpiece delivery point with high precision and consistency. An aspect of the invention is a conveyor system for carrying flat thermoplastic blanks through an impingement convection oven in connection with which the invention will be described.

Attention is called to related pending U.S. application Ser. No. 554,967 filed Nov. 25, 1983 on which I am co-inventor with Donald P. Holmes, now U.S. Pat. No. 4,520,575.

Some theremoplastic resins may be heat treated by exposure to a sequence of heating and cooling to achieve desired properties. Examples of such resins or plastics are polyethylene terephthalate (PET), polypropylene (PP), and polyvinyl chloride (PVC). The workpieces being so heat treated may be of a single resin or may have multiple layers. Careful or close control of temperature and residence time in the oven are both important toward achieving the desired temperature distribution through the workpiece.

The present invention deals with a conveyor system for moving flat resin (thermoplastic) workpieces (called chips) through an oven for heating them to a predetermined temperature by a forced convection means. The instant conveyor provides pockets on a belt conveyor to contain the chips and prevent them from moving off the belt under the influence of the streams of hot air (more broadly hot fluid or gas) forming the convection medium. Moreover, the belt is permeable, e.g. it is made of a porous mesh material so that the convection medium (frequently of high velocity hot air) can contact the underside as well as the top side. The heating-convection streams striking both sides of the chip would cause chip movement but for, inter alia, provision of the pockets plus adjustment of air pressure on each side of the chip or belt (e.g., preferably higher total and static pressure above the belt than below).

Also, the heating and other factors cause the conveyor system to change dimensions, ordinarily to "grow" whereby the dimensions get larger. The present invention provides a system that compensates for such growth while maintaining belt tension. This system lets one end of the conveyor system move in response to such growth but keeps the other end fixed whereby cooperating equipment (e.g. hot chip handling means) at the fixed end does not require adjustment or compensation for growth.

An object of the invention is to provide an improved conveyor. An object of the invention is to provide an improved perforate conveyor belt for carrying small flat workpieces through a domain wherein high velocity fluid jets impinge on same.

An object of the invention is provision of an improved conveyor drive and support system. An object of the invention is provision of a conveyor drive and support system that compensates for dimensional changes and is capable of periodic as well as continuous movement.

Other objects, advantages and features of the invention will become apparent from the following specification and drawings wherein:

FIGS. 3 and 4 are respective enlarged top and cross-section views of a preferred embodiment of conveyor and its tracks as seen along section 4—4 of FIG. 1;

FIG. 5 illustrates a preferred mode of the chip nesting in the conveyor as seen on section 5—5 of FIG. 3;

Figure 6:
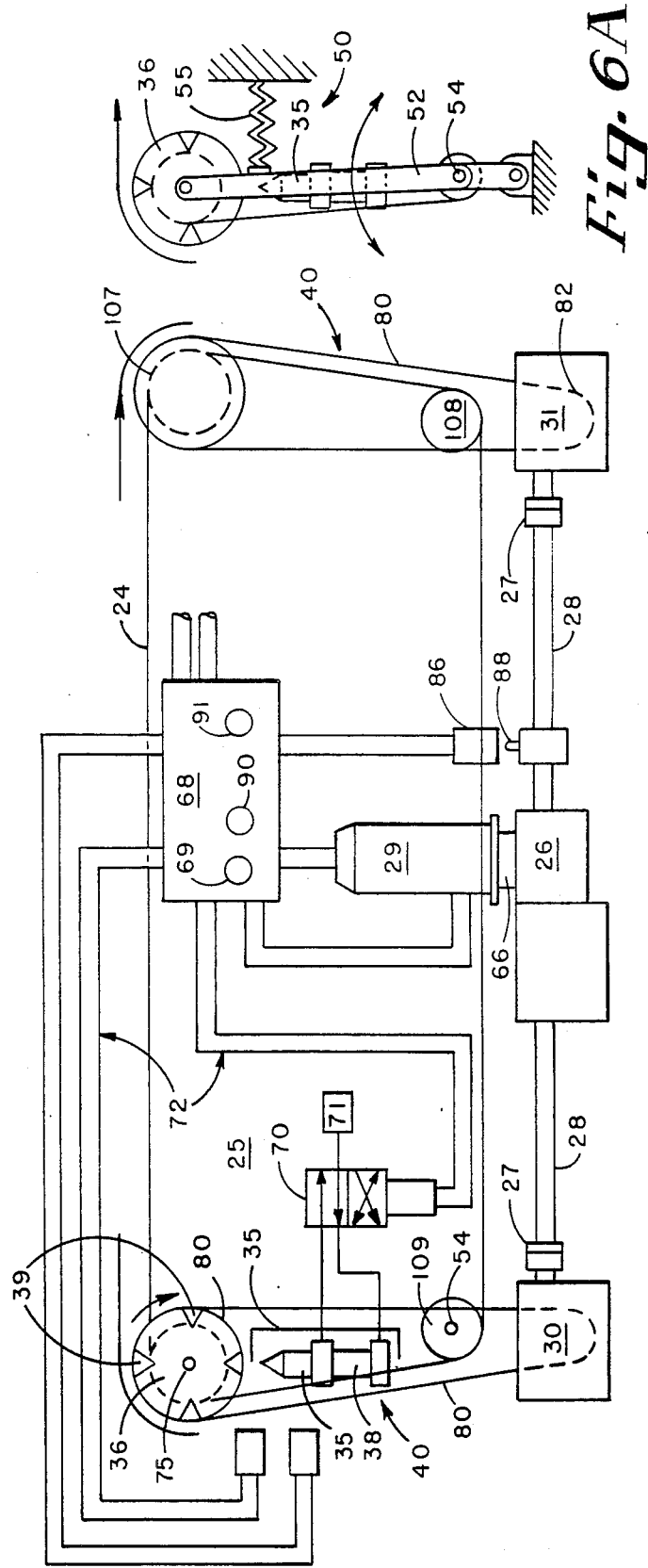
Figure 7:
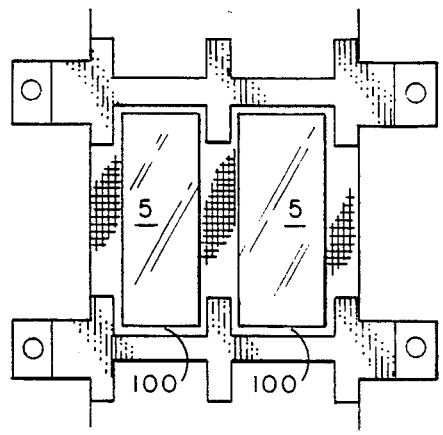
Figure 8:
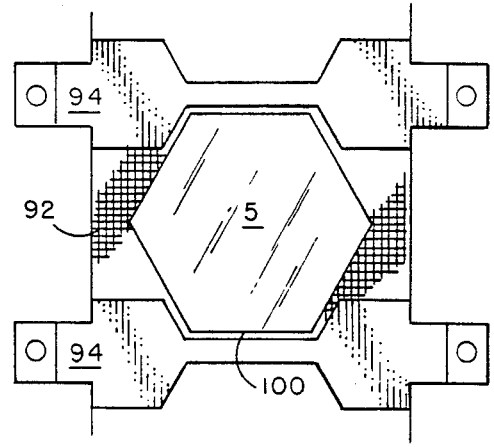
Figure 9:
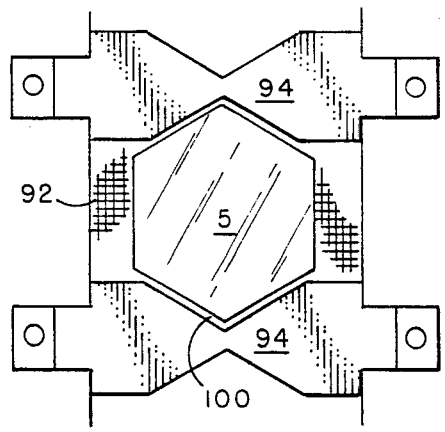
Figure 12:
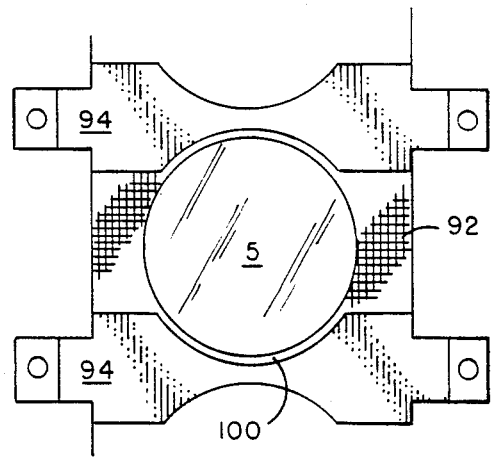

FIG. 6 and 6A schematically illustrate an embodiment of conveyor compensating system;

FIGS. 7, 8, 9, and 12 illustrate other configurations of workpieces, pockets, and pocket tabs defining same;

FIGS. 10 and 11 illustrate schematic side views in pertinent part of a preferred embodiment of the compensating feature;

FIG. 12 is described with FIGS. 7, 8, 9;

FIG. 13 is a section along 13—13 of FIG. 11 showing a preferred mode of supporting the shot pin; and FIG. 14 is an enlarged section on 14—14 of bias means of FIG. 10.

INTRODUCTION

The present invention contemplates in its preferred construction and use that a number of square plastic blanks (also called workpieces or chips) according to FIGS. 3, 5 will be processed simultaneously shown as four at a time being heated in an oven. Such chips may be loaded onto a conveyor manually or by some suitable means such as that described in U.S. Pat. No. 4,183,979. Similarly, the chips may be removed from the conveyor (hence oven) manually or by some suitable means which may include an apparatus as described in U.S. Pat. No. 4,096,953. And, ultimately, chips of plastic removed from the oven, as by '953, may then be processed in a forming machine such as, but not limited to, a machine as described in U.S. Pat. No. 4,133,625 which is the presently preferred end use of chips processed with the instant conveyor, namely heated in an oven.

Figure 1:
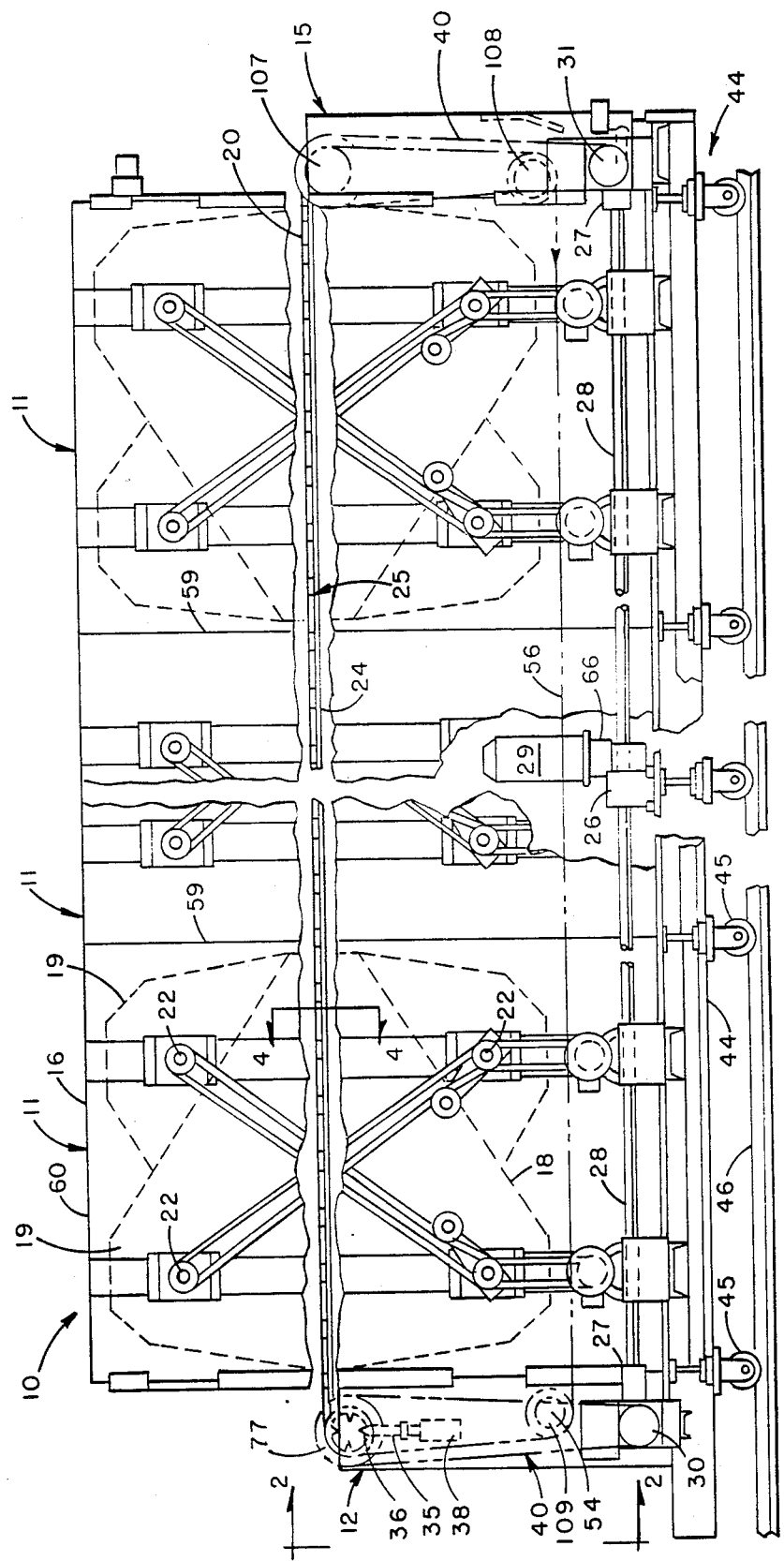
FIG. 1 is an elevation or side view of a preferred embodiment of the instant oven as constructed from preferred modules showing a carriage on which the same is mounted and illustrating drive means for operating air circulation blowers and indexing the chip conveyor.
Figure 2:
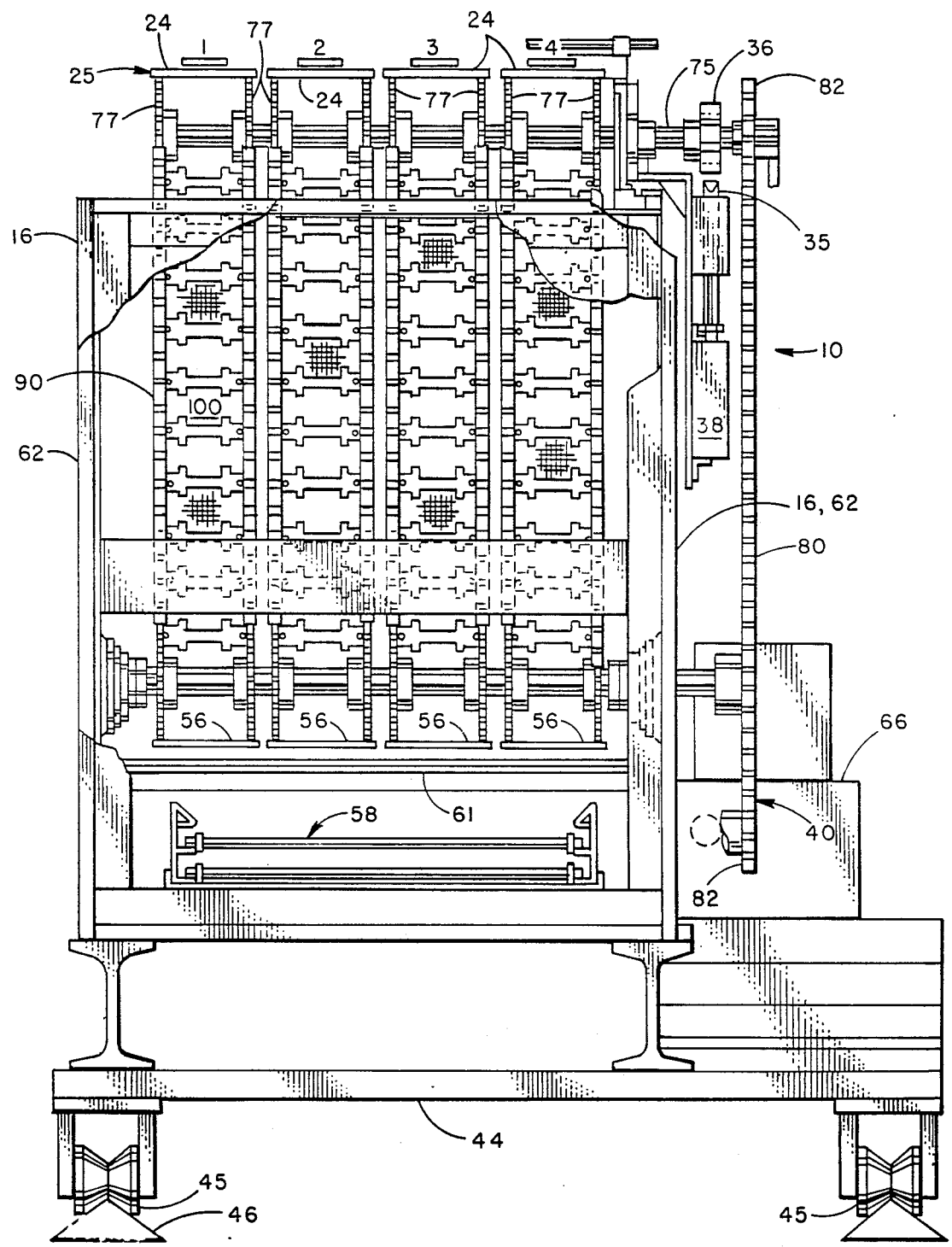
FIG. 2 is a partly cutaway view of an end closure or cabinet for the chip conveyor as viewed along section 2—2 of FIG. 1.

Referring to FIGS. 1–6, there is illustrated an oven built up from modules for heating four chips at a time. FIG. 2 embodiment shows four paths (lanes) respectively designated from left to right 1, 2, 3, and 4. A square workpiece or chip 5 with lower face 6 and upper face 7 is thermoplastic resin and is shown in FIG. 5 and for purposes of further examples herein may be of monolayer polypropylene with a melt index in the range of from about 0.5 to about 30 (as determined by ASTMF-1238L) having a Length, Width, and Thickness (respectively L, W, T) of 2.47 inches by 2.47 inches by 0.150 inches, respectively. Multilayer chips of the same material and dimensions composed of white-mineral-pigment-filled polypropylene outer layers of about 0.074 inches thick adhered to a middle barrier layer of either ethylene vinyl alcohol (EVOH) or Saran (polyvinylidene chloride) with an adhesive such as a polypropylene blend or an ethylene vinyl acetate glue such as duPont 3175 EVA have also been used to make a white opaque container as shown in U.S. Pat. No. 3,995,763.

Copolymers and other thermoplastic resins may, of course, be employed.

The preferred embodiment of chip is square. Other geometric figures may be processed, it being understood the invention embraces (FIGS. 7, 8, 9, 12) conveyance of chips having different thicknesses or geometric configurations (circular (FIG. 12), hexagonal (FIGS. 8, 9), rectangular). A number of different positions on the conveyor and chip sizes are embraced hereby. For instance, the hexagonal shape of FIGS. 8, 9 may be oriented with a flat side fore-and-aft (direction of movement) as in FIG. 8 or with a point fore and aft as in FIG. 9. The conveyor pockets to hold the chips are shaped accordingly (compare FIGS. 3, 7-9, 12) and there may be more than one chip cross machine as shown in FIG. 7.

Another aspect of the invention is means (FIGS. 6, 10) to compensate the instant conveyor for changes in tension, size change, stretching, and the like.

GENERAL ORGANIZATION OF THE CONVEYOR (FIGS. 1, 2, 3, 4)

The instant conveyor as shown in its preferred use with an oven 10 that comprises a plurality of serially arranged modules 11 extending between a loading station 12 and an unloading station 15. The modules 11 are preferably all built alike, and while usually a number of them are used in series for a given lane, it is possible to accomplish some heating operations with only a single module.

Each module may be tuned to provide a different temperature change as the chips are transported through them. There also are a plurality of different air pressures.

Referring to FIGS. 1 and 2 especially, each module comprises an enclosure wall 16 having four plenum chambers 18 arranged laterally below a chip carrying means and four plenum chambers 18 disposed above and opposite to the ones below. The respective plenum chambers 18,19 are disposed to impinge from lower and upper sources—here nozzle plates 20 which are also called 20A (for above) and 20B (for below the chip) per FIG. 4—at substantially right angles streams of hot compressed air against opposite surfaces 6,7 of the chip or workpiece presented between the nozzle plates. Each plenum chamber 18 has a blower and heater means located at the upper end 22 thereof (opposite nozzle plate 20) to provide heated compressed air at a suitable pressure and quantity. The air, of course, emerges from the respective nozzle plate 20 which comprises the exhaust means from each plenum chamber and which impinges a plurality of hot air streams about normally against the chips from the holes forming the nozzles in plate 20.

The chips 5 are conveyed on the upper or conveyor course 24 of a conveyor 25 which moves in an indexing fashion from left to right as seen in FIGS. 1 and 4 and normal to the paper toward the reader as seen in FIG. 5. An indexing angle type drive 26 is provided for this system and it causes the conveyor, hence the chips 5 conveyed thereby, to stop at a plurality of places as they progress through the oven. The stopping is required by the mode and manner of loading and unloading. It should be understood that while the instant oven contemplates and prefers an indexing type of drive wherein the chip conveyor advances periodically (e.g. moves distance C in FIG. 3 by stop-and-go movement from load to unload end), the invention is broad enough to include a constantly moving conveyor. A group of four chips at a time, arrayed cross machine each on its own conveyor 24, move through the oven along the respective lanes 1, 2, 3, 4—see FIGS. 2, 3.

Because it may be necessary to precisely stop and position the chips when unloaded from the oven, precise positioning control is exercised by conveyor drive system that includes indexing gear reducer transmission 26, which includes and is driven by an electrical motor 29. Drive 26 indexes both ends of the chip conveyor in timed and position relationship by indexing both the load end 12 and unload end 15 of the conveyor by drive shafts 28. Transmission 26 is preferably located about the middle of the oven with shafts 28 extending toward each end, as illustrated. There is a sliding fit 27 between respective shafts 28 and driven stub shafts at angle drives 30,31 to permit linear movement in response to dimensional changes due to heat wear, stretching and the like. Splined or keyed connections at 27, of course, establish and keep the requisite driving relationship.

A shot pin 35 and notched wheel 36 provide means for positive engagement for additional exact positioning control of the chip conveyor 25. Double acting air cylinder 38 manipulates shot pin 35 to withdraw and advance it into the notches 39 (FIG. 6) in wheels 36 so that the chips can be stopped exactly where required. Appropriate pulleys and drive chains (collectively 40 and see 80,82 below) connect the indexing transmission with the chip conveyor. Precise stopping location is necessary for engagement with loading means, unloading means and placement ultimately in the means for further processing.

The overall oven arrangements shown, for example, in FIGS. 1, 2, 6, 10 contemplate that all of the modules 11 as well as the front and rear chip conveyor drive sections are mounted on a carriage assembly 44 which has wheels 45 that ride on rails 46 and a spring biased means 50 (FIGS. 6A, 14) to compensate for dimensional change. The carriage-wheel arrangement permits positioning the assembled oven relative to other equipment and also provides a means for accomodating thermal expansion and contraction of the oven and belt during start-up and shut-down. The modules 11 comprising the oven are assembled on top of the illustrated I-beams forming the carriage and secured thereto by any suitable means such as welding, nuts-and-bolts, etc.

FIG. 6A shows schematically pivot arm 52 that swings about center 54 and is biased or continuously urged by spring 55 as a means to compensate for dimensional change of the carriage. There is one such on each side of the oven. This has the effect, too, of maintaining tension in the upper course of the conveyor, i.e. that course on which chips 5 are conveyed. The lower return course 56 (FIG. 2) does not need a tension device.

FIGS. 10, 11, 14 show a preferred embodiment of a spring-biased compensating means 50 comprising (on each side of the oven or other treating means) a slide 120 supporting the conveyor shaft 75 and sprockets 77, shot wheel 36, and depending bracket 122 on which the shot pin 35 is mounted, thus to allow shaft, wheel, pin, and sprockets to move together on ways under the urging of spring 124. Oven carriage frame elements support the ways and spring. The ways 126 are channel shaped to provide lateral and vertical constraints. This construction moves the sprocket and shot pin in unison on their pendant bracket 122.

A trash conveyor 58 preferably of commercially available endless roller chain type is provided at the bottom of the oven. The commercial endless construction preferably has a roller chain around sprockets on each side, perforate metal grids or plates connected between them, and one sprocket drive from one of the angle drives.

Each module 11 comprises housing 16 that defines an enclosure within which the instant conveyor moves chips 5 through heating operations and within which are the various plenum chambers 18,19. The housing preferably has insulated external walls although serially adjacent modules preferably do not have insulation between their adjacent or facing end walls 59. Enclosure top, bottom and sides 60,61,62 (FIGS. 1, 2) are preferably insulated, however.

SUMMARY OF INDEXING SYSTEM OF FIGS. 1, 2, 6, 10

The simplest way to achieve indexing drive here is to buy a commercially available indexing gearbox 26 and drive it from the electric motor 29 as part of the indexing system. In such case, the motor runs continuously and the gearbox mechanically provides a periodic motion sufficient to advance chip conveyor 25 the required amount, the gearbox also providing the requisite dwell period of time so that chips are heated properly at each dwell station in the oven. However, certain failsafe features may want to be incorporated to prevent indexing or to stop in case of malfunctions. Further, it may be desirable to provide some way to adjust dwell time during which the chip conveyor 25 stays in one position. The system of FIGS. 1, 2, 6 illustrate a preferred manner of accomplishing these things by using an electric clutch 66 to connect and disconnect the drive motor with the rest of the system and using timers to shut down if events do not occur within a preselected time interval.

Referring to FIG. 6, there is shown a programmable controller 68 having a start button 69, electric motor 29 (which is commercially supplied as part of the indexing angle drive 26), electric clutch-brake combination 66 driven by the motor and located between it and the gear reduction and indexing drive 26. The system also includes double acting air cylinder 38 to which air is controllably admitted by the control valve 70 from a source 71. The programmable controller 68 upon receiving information responds and sends signals to control valve 70 through wires or other suitable communication channels 72 thereby to selectively position the shot pin 35 in a notch of the shot wheel 36 or to withdraw it therefrom, as the case may be.

Shot wheel 36 is mounted on the same shaft 75 with the sprockets 77 (FIGS. 2, 10) which drive the chip conveyors 25 with drive belts or chains 80 and pulleys 82 connecting the gear boxes 30,31 to the drive shafts 75 on which the sprockets 77 are located.

Three proximity switches 84,85,86 provide a variety of signals to the programmable controller 68. Switches 84,85 (FIG. 11) respectively sense the position of shot pin 35 as being out of the shot hole 39 (i.e. in the withdrawn position illustrated in FIGS. 6, 10) or inserted in the shot hole (as illustrated in FIG. 1). Proximity switch 86 (FIG. 6) senses the position of a rotating flag 88 on shaft 29 to advise controller 68 that an index is complete. This permits controller 68 to operate clutch 66 to disconnect motor 28 from driving indexer 26, hence drive shafts 28, etc.

The controller has timer preselection means 90,91 to set cycle timer and an alarm timer and preferably is programmed so that At the same time the alarm timer 91 initiates its routine, cycle timer 90 starts a process whereby air is supplied through 70 to withdraw pin 35 from notch 39 where it has been residing. This is done by the controller sending appropriate signals over channel 72 to the control valve 70 and operating air cylinder 38 in a well-known manner to withdraw the pin.

At this point a fail-safe decision process takes place serially within controller 68 after the start of the cycle timer to check on whether or not the shot pin 35 is really out, which is detected by the paired proximity switches 84,85 which together report, respectively, the absence of the shot pin in the wheel notch by switch 85 and the presence of the shot pin in the wheel notch via switch 84.

Electric motor 29 is operating so that at this time engagement of clutch 66 drives the indexing angle gear box 26 preferably through exactly one revolution. Proximity switch 86 by reading the position of flag 88 on the drive shaft 29 reports the event of one rotation to controller 68 which then disengages by reading the position of flag on the clutch 66 and stops rotation of shaft 28, hence chip conveyor advance for a time interval equal to the desired conveyor dwell.

As long as proximity switch 86 does not read flag 88 as having completed one complete rotation, indexing may occur. Of course, a counting means could be provided to permit additional rotations as a less preferred embodiment. As long as oven index complete reports no to the controller the connection or engagement of clutch 66 continues. However, the clutch is again disengaged and the motor stops driving the index box when index complete is announced in response to a signal sent to the controller by the switch 86.

Stopping the conveyor advance also requires its precise positioning by moving shot pin 35 into a notch 39 on wheel 36. Note that four notches are provided in FIG. 1, indicating a 4:1 reduction between gearbox 26 and wheel 77 in the illustrated system. Controller 68 now fires cylinder 38 and drives shot pin 35 into whatever notch is presented. If pin 35 has not been able to drive all the way into its notch an alarm is sounded as a result of switches 84,85 reporting to the controller.

Ordinarily, however, the pin 35 drives into the notch.

CHIP CONVEYOR (FIGS. 3, 4, 5, 7, 8, 9, 12)

The chip conveyor 25 provides a pocket into which each chip 5 is placed by the person doing the loading or the loading machine. The pocket keeps the chip where it has been placed despite factors such as the air blasting from nozzle plates 20.

Conveyor 25 comprises a pair of roller chains 90 mounted on sprockets to travel in a rectangular path. The chains are on each side of the conveyor and between them suspended a belt assembly on which the chip rests. Preferably, this belt has a Teflon (polytetra-flouroethylene) coated fiber glass mesh belt 92 on which the chip rests. A crossbar 95 on the bottom of the mesh, and an H-shaped bar 94 on top of the mesh and clamped by a fastener such as a bolt or pop rivet 96 that (if a bolt it threadably engages a tapped hole in a crossbar 95) to secure the mesh-and-bar assembly to the conveyor lugs 99. H-bars 94 also extend across the mesh to define a pocket 100 between each two of them in which the chip 5 nestles while resting on the mesh. The pair of roller chains are commercially available with inward facing lugs 99 to which the tie bars are secured. The fiberglass mesh belt is, less preferably but alternatively, coated with a cured silicon rubber coating—and even less preferably with a release agent—to reduce or eliminate sticking of workpieces. The belt is porous, or perforate for air flow—like screen wire in a sense and makes a continuous loop, the ends of the belt being secured between a pair of bars 94,95.

The weight of the chain requires the rollers 102 thereof to move along horizontal tracks 104 which latter are secured to and part of the enclosure structure. The horizontal tracks 104 are preferably a shroud against air flow formed from a channel section with the open side facing inwardly of each vertical pair of plenums to provide approximately equal area and resistance to return air flow past the roller chain back to the heaters. A like arrangement of horizontal channel tracks 104 is provided for the return course 56 (FIG. 1) of the chip conveyor that travels along the bottom part of each enclosure. Please note that usually each module 16,18,19 comprises a grouping of plenums with a heater and blower. When the modules themselves are arranged serially, then the requisite chip conveyor, trash belt and end closures are provided.

The H-bars may have more than one upright as in FIG. 7 where more than one chip is on the conveyor between chains. The uprights (to which the reference line from 94 extends in FIGS. 4, 8 and 12—the cross bar being touched by the reference line 94 in FIG. 3) may also have other than rectangular shapes e.g. FIGS. 8, 9, 12 to provide a pocket contoured to the chip shape.

The chip conveyor moves in endless belt fashion around a substantially rectangular path comprising upper and lower horizontal courses 24,56 on track 104 and around upper and lower sprockets 77,107,108,109 located in the load and unload stations 12,15 so that the conveyor itself is exposed sufficiently for loading and unloading and to minimize air leakage and heat loss. The chip conveyor drive shaft 75 and shot pin 35 coaction have already been described.

What is claimed is:

1. An endless conveyor belt assembly comprising
    a pair of spaced apart roller chains each of endless configuration;
    a perforate mesh workpiece support coated with a coating selected to be nonadherent to the material intended to be carried and disposed between said chains and coextending therewith; and
    a plurality of H-shaped bars each having a crossbar connected between said chains and with the crossbar perpendicular to the conveying direction, and each further having at least two uprights having a length in the conveying direction larger than the width in said conveying direction of said crossbar to form an H-shaped bar and with said mesh supported underneath each pair of bars forming a pocket in the space defined between their crossbars and uprights.

2. An endless conveyor belt assembly according to claim 1 further comprising
    a plurality of bottom bars each disposed underneath each of the crossbars of said H-shaped bars and with said mesh therebetween; and
    securing means to hold said bottom bars and mesh against the underside of said crossbars.

3. An endless conveyor belt assembly according to claim 1 further comprising
    a plurality of bottom bars each disposed underneath each of the crossbars of said H-shaped bars and with said mesh therebetween; and
    said H-shaped bars being about the thickness of the workpiece intended to be carried in said pocket.

4. An endless conveyor belt assembly according to claim 1 further comprising
    a plurality of bottom bars each disposed underneath each of the crossbars of said H-shaped bars and with said mesh therebetween;
    securing means to hold said bottom bars and mesh against the underside of said crossbars; and
    said H-shaped bars being about the thickness of the workpiece intended to be carried in said pocket.

5. An endless conveyor belt assembly according to claim 1 further comprising
    a plurality of bottom bars each disposed underneath each of the crossbars of said H-shaped bars and with said mesh therebetween; and
    roller chain supports comprising means to shroud the belt in the region of the belt and substantially along the portion of the path traversed with workpieces in the pockets.

6. An endless conveyor belt assembly comprising
    a pair of spaced apart endless flexible power transmitting members;
    a plurality of H-shaped bars each having a crossbar connected between said members and with the crossbar perpendicular to the conveying direction, and each further having at least two uprights having a length in the conveying direction larger than the width in said conveying direction of said crossbar to form an H-shaped bar each pair of bars forming a pocket in the space between their crossbars and uprights; and
    a perforate workpiece support located across the bottom of said pocket.

7. An endless conveyor belt assembly according to claim 6 that comprises
    a plurality of bottom bars each disposed underneath each of the crossbars of said H-shaped bars and with said mesh therebetween; and
    securing means to hold said bottom bars and mesh against the underside of said crossbars.

8. An endless conveyor belt assembly according to claim 6 that comprises
    a plurality of bottom bars each disposed underneath each of the crossbars of said H-shaped bars and with said mesh therebetween;
    securing means to hold said bottom bars and mesh against the underside of said crossbars; and
    said H-shaped bars being about the thickness of the workpiece intended to be carried in said pocket.

9. A conveyor belt according to claim 1 wherein said coating is polytetraflouroethylene.

10. A conveyor belt according to claim 1 wherein said mesh is fiberglass.

11. A conveyor system comprising
    an endless conveyor belt assembly according to claim 1;
    a plurality of sprockets supporting each chain of said assembly along an upper and conveyor course and along a lower return course;
    means movably supporting the end ones of said sprockets of said upper conveyor course; and
    means for compensating said upper conveyor course and its pockets by continuously urging said means for movably supporting and said end ones of the sprockets in unison in a direction away from that sprocket at the other end of said upper conveyor course.

12. A conveyor system according to claim 11 wherein said means for compensating by urging includes a spring supported to bias in said direction.

13. A conveyor according to claim 12 where said means for movably supporting includes at least one pivotable link on which said end sprockets are revolvably supported.

14. A conveyor according to claim 12 where said means for movably supporting includes
a slide supported to reciprocate relative to the machine frame; and
said means for urging includes a spring biasing said slide in said direction.

15. A conveyor system according to claim 11 further including a drive means for turning at least a portion of said sprockets thereby to advance said chain intermittently; and a means for positive engagement with said drive means for positioning control to locate conveyor belt assemblies at a predetermined position with each advance.

16. A conveyor system according to claim 15 wherein said positive engagement positioning control means comprises a shot pin that engages said drive means.

17. A conveyor system according to claim 15 further comprises means for shrouding the belt along the opposed edges thereof traversed with the workpieces.

18. An endless conveyor belt assembly according to claim 17 wherein said means for shrouding comprises a channel member disposed along each opposed edge of said belt with the chain and belt edge received in the space between web and flanges of said channel.

* * * * *